United States Patent
Tran Quoc et al.

(10) Patent No.: US 7,897,966 B2
(45) Date of Patent: Mar. 1, 2011

(54) METHOD FOR MANUFACTURING FLAT SUBSTRATES

(75) Inventors: Hai Tran Quoc, Orsay (FR); Jerome Villette, Le Plessis Robinson (FR)

(73) Assignee: Oerlikon Solar AG, Trubbach, Trubbach (CH)

( * ) Notice: Subject to any disclaimer, the term of this patent is extended or adjusted under 35 U.S.C. 154(b) by 0 days.

(21) Appl. No.: 12/372,813

(22) Filed: Feb. 18, 2009

(65) Prior Publication Data

US 2009/0155494 A1    Jun. 18, 2009

Related U.S. Application Data

(63) Continuation of application No. 11/427,048, filed on Jun. 28, 2006, now Pat. No. 7,514,374.

(60) Provisional application No. 60/695,111, filed on Jun. 29, 2005.

(51) Int. Cl.
*H01L 29/10* (2006.01)

(52) U.S. Cl. .................... 257/49; 257/64; 257/E31.043; 257/E31.045

(58) Field of Classification Search .................... 257/49, 257/53, 64, 75, 428, 431, 436, E31.002, E31.003, 257/E31.032, E31.043, E31.045, E21.043
See application file for complete search history.

(56) References Cited

U.S. PATENT DOCUMENTS

| | | | |
|---|---|---|---|
| 5,177,578 A | 1/1993 | Kakinoki et al. | |
| 5,677,236 A * | 10/1997 | Saitoh et al. | 438/485 |
| 5,811,195 A | 9/1998 | Bercaw | |
| 5,863,602 A | 1/1999 | Watanabe et al. | |
| 5,970,383 A | 10/1999 | Lee | |
| 5,981,899 A | 11/1999 | Perrin et al. | |
| 6,071,573 A | 6/2000 | Koemtzopoulos | |
| 6,335,540 B1 * | 1/2002 | Zhang | 257/53 |
| 6,530,992 B1 | 3/2003 | Yang et al. | |
| 6,790,793 B2 | 9/2004 | Nishino et al. | |
| 6,828,254 B2 | 12/2004 | Han et al. | |
| 6,881,684 B2 | 4/2005 | Aota et al. | |
| 6,902,629 B2 | 6/2005 | Zheng et al. | |
| 6,974,781 B2 | 12/2005 | Timmermans et al. | |
| 7,204,913 B1 | 4/2007 | Singh et al. | |
| 2005/0214454 A1 | 9/2005 | Yang et al. | |
| 2005/0257747 A1 | 11/2005 | Wakabayashi et al. | |
| 2006/0205205 A1 * | 9/2006 | Han et al. | 438/633 |

FOREIGN PATENT DOCUMENTS

JP    2002-289557 A    4/2002

OTHER PUBLICATIONS

P. Roca I Cabarrocas, "Microcrystalline silicon: An emerging material for stable thin-film transistors," Journal of the SID, Dec. 1, 2004.

* cited by examiner

*Primary Examiner*—Caridad M Everhart
(74) *Attorney, Agent, or Firm*—Pearne & Gordon LLP

(57) ABSTRACT

For avoiding the metallic inner surface of a PECVD reactor to influence thickness uniformity and quality uniformity of a μc-Si layer (19) deposited on a large-surface substrate, (15) before each substrate is single treated at least parts of the addressed wall are precoated with a dielectric layer (13).

13 Claims, 5 Drawing Sheets

METHOD FOR MANUFACTURING FLAT SUBSTRATES

BACKGROUND OF THE INVENTION

Figure 1:
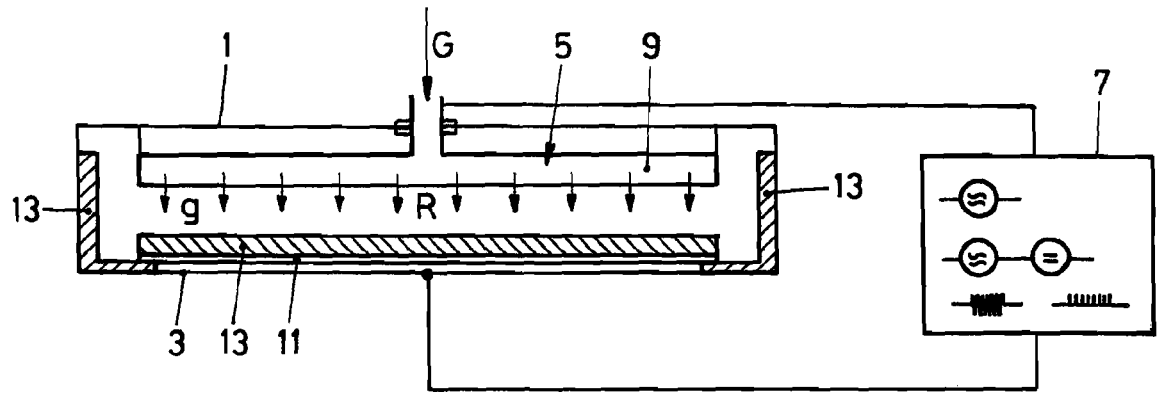

The present invention relates to the production of flat substrates with an extent of at least 2500 cm$^2$ and having a silicon layer deposited by means of a PECVD process in a vacuum reactor. Thereby, substrates are manufactured whereupon, generically, the silicon layer becomes part of semiconductor devices as in manufacturing flat substrates for thin film transistor displays (TFT) or for liquid crystal displays (LCD), or for solar cells or for organic light-emitting displays (OLED).

In today's manufacturing of such flat large substrates with a silicon layer, amorphous silicon (a-Si) is the most commonly used material for such layer. These layers are commonly deposited by a PECVD process. Unfortunately, however, a-Si has relatively poor electronic properties and a-Si-based devices on such flat substrates tend to show important degradations under electrical stress.

It is known in the art that crystalline silicon (μc-Si as well as "polycrystalline silicon") could be a good candidate for replacement of a-Si, as devices made of more crystalline material exhibit better performance such as higher electron mobility (higher field effect mobility), higher ON-current and tend to degenerate less over time (threshold voltage shift).

It is also known in the art that highly crystalline material can be produced by plasma-enhanced chemical vapor deposition processes (PECVD) using standard equipment and plasma-activating a mixture of silicon-containing gas, halogen-containing gas, hydrogen and a noble gas. We refer, as an example to P. Roca i Cabaroca et al. in "Journal of SID" Dec. 1, 2004, where methods are reported for growing on top of a silicon nitride layer (SiN) μc-Si material from a SiF$_4$—H$_2$—Ar gas mixture. The problem inherent to this methods is that of poor uniformity of thickness and of quality for both, the underlaying dielectric layer—SiN—as well as the addressed μc-Si layers. The degree of uniformity of thickness and of quality is governed by the chemical and electrical homogeneity in the near-the-substrate environment. Indeed, both films, dielectric film and μc-Si film, have been found to be thinner and of different chemical composition at a peripheral portion of the substrate compared with these characteristics in the more central portion of the substrate.

It is an object of the present invention to provide a method for manufacturing flat substrates with an extent of at least 2500 cm$^2$, substantially centrally symmetrically and having a Si layer deposited by means of PECVD processing in a vacuum reactor, whereat uniformity of at least one of layer quality and of layer thickness along the substrate up to its periphery is improved. This is achieved by such method which comprises:

a) generating an RF plasma discharge in a reaction space between the electrodes;
b) depositing on at least a part of the inner surface of the reactor a dielectric precoat;
c) introducing one substrate into the reactor with a first surface towards said first electrode;
d) depositing on a second surface of the substrate a dielectric layer;
e) PECVD depositing on said dielectric layer said Si-layer as a μc-Si layer and
f) repeating steps b) to e) for each single substrate to be manufactured.

For the dielectric layer as deposited in step d) the thickness non-uniformity mainly results from the higher etching rate at the peripheral portion of the substrate also during subsequent Si-layer deposition. Etching radicals originate especially from the plasma used to grow the μc-Si layer in step e). The increase in etching rate towards the periphery of the substrate is believed to be caused by a higher proportion of these etching radicals near the edge of the substrate compared to such proportion in a more central area of the substrate. This can be understood knowing the good chemical neutrality of aluminum alloys with respect to fluorine, which alloys are customarily used for semiconductor fabrication vacuum reactor's wall. Such neutrality—lack of consumption—leads to an increased proportion of etching radicals along the surface of aluminum alloy of the reactor's inner wall and thus to an increased etching rate at the periphery of the substrate. It must be pointed out that the footprint of the vacuum reactor is customary dimensioned as small as possible in view of the dimension of substrates to be manufacture therein. Therefore the spacing between reactor's metallic wall and the edge or periphery of the substrate to be manufactured is not tailored so large that the addressed effect of such wall could be neglected.

Indeed, a most commonly used aluminum alloy for PECVD reactors is an aluminum magnesium alloy, because it develops a protective fluorine-based outer layer and can therefore easily withstand a cleaning step. Thereby, customarily fluorine radicals, as from NF$_3$ or SF$_6$ in plasma are used during such plasma-enhanced cleaning without corrosion of the vacuum reactor's inner surface for standard PECVD silicon processes.

Due to the chemical neutrality of the inner surface of the PECVD reactor the available quantity of etching radicals is higher near the edges of the substrate and these radicals migrate, as by osmotic effect, onto the substrate's peripheral area. The smaller that the footprint of the reactor's inner space is dimensioned compared with the dimension of the substrate, the more pronounced is this effect. The higher quantity of available etching radicals, fluorine radicals, will affect the μc-Si layer growth at the peripheral area of the substrate as by affecting crystallization. Therefore, the local perturbation of the chemical balance between etching- and growth-contributing radicals leads to lowering the deposition rate as well as changing the Si-material composition between defined crystalline fractions, amorphous fractions and voids at the peripheral area of the substrates. Generically, such decrease in layer thickness and change of material composition towards the edge of the substrate leads to undesired deviations of characteristics of semiconductor devices produced along the substrate and towards the periphery of the substrate, relative to characteristics of such devices more centralized on the substrate.

By depositing on at least a part of the inner surface of the reactor a dielectric precoat, before introducing the substrate, and then performing layer deposition upon the substrate, which includes depositing the μc-Si layer as a silicon layer, the inner surface of the vacuum reactor, which is metallic, as was addressed mostly of an aluminum magnesium alloy, is shielded from the precursor gas as used especially during deposition of the μc-Si layer. It is believed that thereby the proportion of etching radicals along the peripheral area of the substrate is kept substantially equal to such proportion in a more centralized substrate area. With respect to spatial relative density distribution of etching radicals, one will encounter substantially no difference in the central area of the substrate and along its periphery.

Thus, the principal which is followed up by the present invention is to present to the plasma activated gas substantially equal conditions, whether seen at the edge or more centrally of the substrate.

Attention is drawn to the following prior art documents: U.S. Pat. No. 5,177,578, U.S. Pat. No. 5,970,383, U.S. Pat. No. 6,071,573, U.S. Pat. No. 5,981,899, U.S. Pat. No. 5,811,195, JP 2002 289 557, P. Roca i Cabaroca et al. in "Journal of SID" Dec. 1, 2004.

The U.S. Pat. No. 5,970,383 teaches to deal with the time development of vacuum reactor wall coverings during manufacturing of series or batches of silicon-coated substrates by resetting the wall characteristics after each batch. Thereby, a coating is applied on the wall of the vacuum reactor. The influence of reactor's wall upon the local uniformity of the single substrate covering is not addressed.

The U.S. Pat. No. 5,981,899 teaches a capacitively coupled RF plasma reactor of the type as may be used to practice the method according to the present invention.

The U.S. Pat. No. 5,811,195 details the use of aluminum magnesium alloys for the walls of a vacuum reactors for semi-conductor processing.

For industrial processes a required uniformity of material properties and of thickness along large substrates of at least 2500 $cm^2$ is important, considered over the whole substrate area. E.g. in layer deposition for TFT-devices, as used for manufacturing substrates for TFT display panels, the final properties of each transistor device of the backplane depend substantially from the thickness of the dielectric layer as deposited in step d) addressed above and on the structural and electronic properties of the intrinsic Si-layer material. Indeed, transistor response is defined by the threshold voltage and by the charge-carrier mobility. Variation in TFT layer thickness and in TFT material property along various areas of the backplane will lead to variations of the transistor properties. This will result in a non-uniformity of pixel luminance over the panel.

The limitations which have been described with respect to the μc-Si layer deposition up to now as from halogen precursor gas are substantially remedied by the manufacturing method according to the present invention and foreseen for industrial-scale production.

The dielectric precoat, which is applied to cover at least parts of the inner surface of the reactor, leads to a substantially ameliorated uniformity of the chemical environment as "seen" from the substrate and along its entire surface to be coated.

When we speak of providing a dielectric precoat on "at least a part of the inner surface of the reactor", we do not want to exclude that some areas of such inner surface will not be covered by the precoat, which uncovered parts being of no or neglectable relevance for the electrochemical environment which the overall surface of the substrate to be coated sees during processing.

In one embodiment of the method according to the present invention the reactor is provided with a substrate carrier first electrode and, spaced therefrom, with a gas shower second electrode and the substrate is introduced in the addressed step c) on the first substrate carrier electrode.

Here the substrate is deposited onto the dielectric precoat applied to the carrier electrode. Customarily the surface of the precoat-covered first electrode is larger than the surface of the substrate deposited thereon. Considering the dielectric layer deposition in addressed step d), there results that the subsequent μc-Si layer deposition "sees" practically continuously a dielectric surface along the substrate and along the projecting precoated electrode surface as well as along wall areas of the reactor, neighboring the carrier electrode and the substrate edge. Thereby electric field uniformity too, especially along the edge of the substrate, e.g. of glass material, is greatly improved.

Due to the manufacturing method of the invention substrates of large surface result, the silicon layer thereon being provided as a μc-Si layer with improved uniformity of thickness and quality up to the edge of the substrate. This makes sure that electrical properties of devices formed on the basis of such silicon layer are of substantially improved local uniformity over the whole substrate area, and, due to the μc-Si deposition, are also of improved stability over time.

In one embodiment of the method according to the present invention at least one of depositing in step b) and of depositing in step d) a dielectric material is performed by PECVD processing.

Considering the fact that in step e) of the method according to the present invention, a μc-Si layer is deposited by PECVD, the overall processing is significantly simplified by making use of the same processing type at least for depositing the precoat according to step b) or to apply the dielectric layer according to step d) or to perform both addressed steps b) and d). Nevertheless, in some circumstances it might be preferred to deposit the precoat layer and/or the dielectric layer by means of e.g. reactive physical vapor deposition (PVD) using an RF plasma discharge as well.

When we talk throughout the present invention of applying or generating an RF plasma, this shall not exclude that besides of an RF supply there might be applied to the respective electrodes additional a DC bias or such RF plasma might be generated by pulsating RF or even pulsating DC of high enough repetition frequency.

Additionally, it has to be considered that for some reasons a microwave plasma might be used. Here microwave energy is coupled into the reactive space of the vacuum PECVD reactor. In this case the first electrode is rather used as a substrate carrier, the second electrode rather as a gas shower for homogeneously introducing the respective gas or gas mixture.

In a further embodiment depositing on the dielectric layer according to step e) a μc-Si layer comprises plasma activating a gas or gas mixture, which produces etching and layer growth-contributing radicals.

In one embodiment such gas is selected to be $SiF_4$.

Still in a further embodiment of the method according to the invention in step e) a gas mixture comprising a silicon-containing gas, a halogen-containing gas and hydrogen is plasma-activated.

Still in a further embodiment of the invention step e) comprises activating a noble gas.

Still in a further embodiment of the invention at least the surface of the substrate to be coated is of glass, customarily today the entire substrate.

Still in another embodiment of the present invention at least one of step b) and of step d) comprises depositing of at least one of silicon oxide, silicon nitride, silicon oxynitride, fluorinated silicon oxide.

Still in a further embodiment of the method according to the invention step b) comprises depositing silicon nitride. Thereby, in one embodiment step b) comprises depositing the dielectric precoat with a thickness d for which there is valid:

$$200\ nm \leq d \leq 500\ nm.$$

Still in a further embodiment the addressed thickness d is selected to be $$200\ nm \leq d \leq 400\ nm.$$

Thereby, it must be considered that the higher this thickness d is selected, the higher will be the risk of precoat material peeling off. Increasing the addressed thickness above the addressed 500 nm will further lead to a decrease in total throughput of the manufacturing equipment due, on one hand to long precoat times and, on the other hand to reduced RF power coupling through such precoat. Coating thicknesses below 200 nm on the other hand have proven to be inefficient to improve the targeted thickness and quality uniformity sufficiently, i.e. to be below a standard specification requiring thickness variation e.g. of less than 10% of an average thickness value considered along the overall substrate surface.

In a further embodiment of the method according to the invention step b) comprises depositing the dielectric precoat as a layer of amorphous material. Thereby, the stress within the precoat layer is significantly reduced. This leads to an improved adherence of such precoat layer to the vacuum reactor metallic inner surface.

In a further embodiment the material of the precoat deposited in step b) and of the dielectric layer deposited in step d) are equal at least considering their composition. Thereby, they need not be equal in structure. Thus, as was addressed the precoat may be deposited as amorphous material which is not done necessarily for the dielectric layer deposited in step d).

Although not always mandatory, in most cases a further embodiment of the present invention comprises plasma cleaning at least the addressed parts of the inner surface of the reactor which are afterwards coated with the dielectric precoat, thus performing such cleaning before performing step b).

In an embodiment the addressed cleaning is performed in plasma-activated $SF_6$ and oxygen.

The method according to the present invention with all embodiments addressed is highly suited for manufacturing thin film transistor display substrates or liquid crystal display substrates or solar cell substrates or organic light-emitting display panels. Thereby, at such substrates the addressed μc-Si layer becomes the intrinsic Si-layer of semiconductor devices, which as perfectly clear to the skilled artisan, are realized following up step e) by additional layers deposited, preferably in the same reactor and without vacuum interruption. Therefore, it has to be emphasized that between the addressed step e) and the addressed step f) one or more than one additional treating steps may be performed before manufacturing of the flat substrate is terminated and before step f) is performed for a subsequent single substrate to be manufactured.

Figure 2:
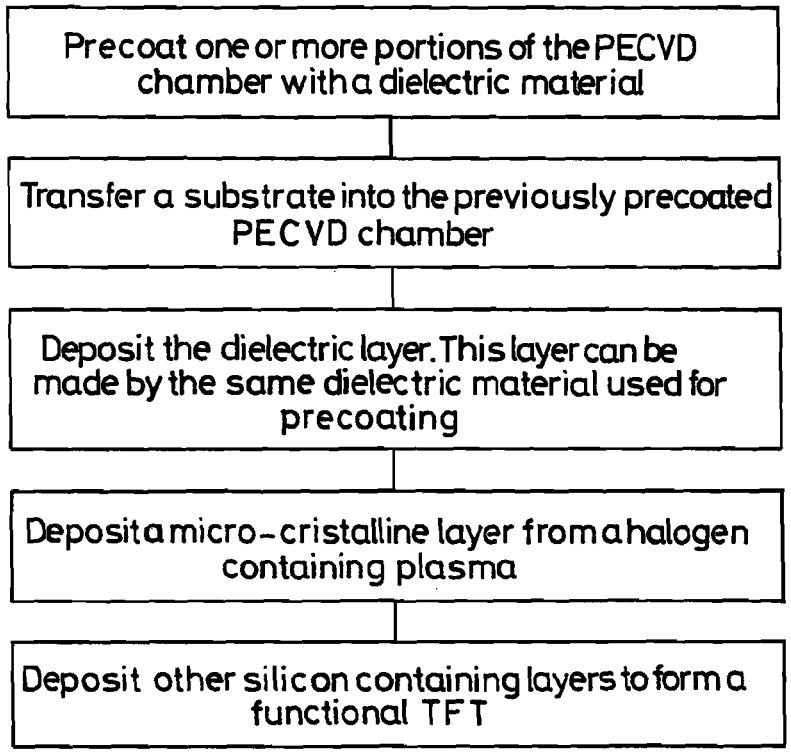
Figure 3:
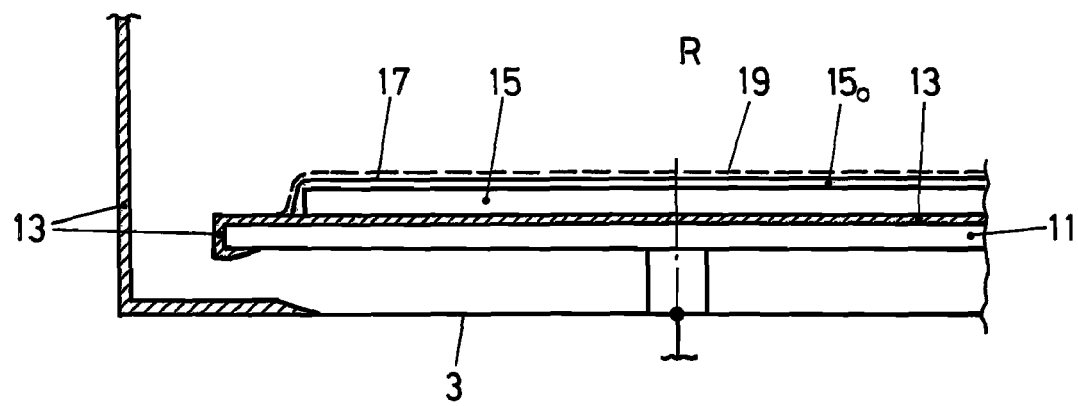
Figure 4:
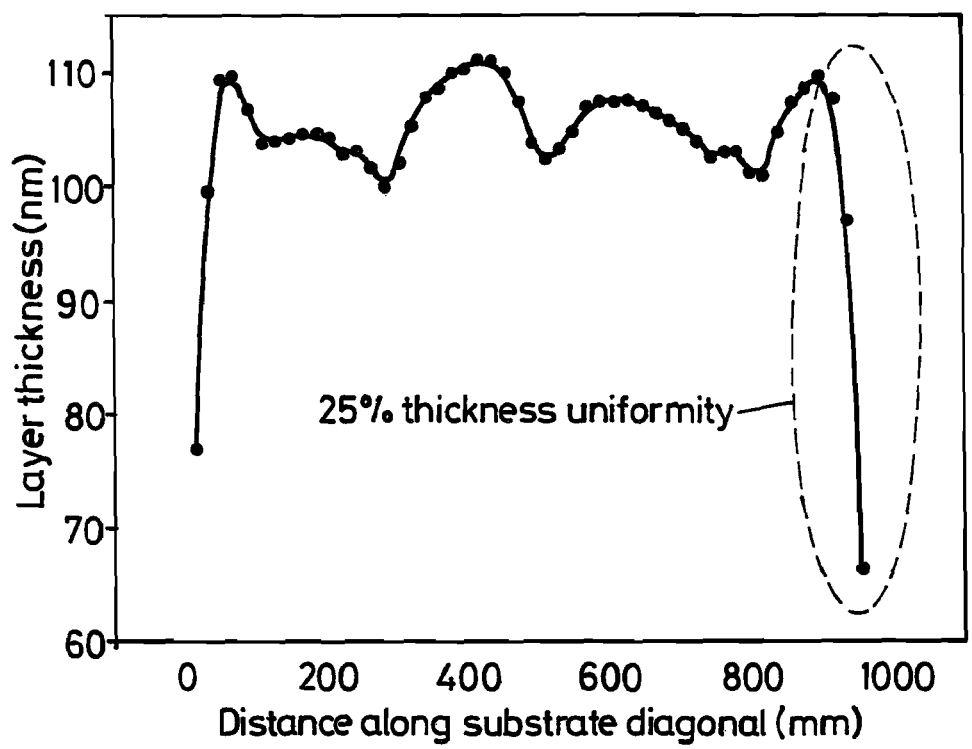
Figure 5:
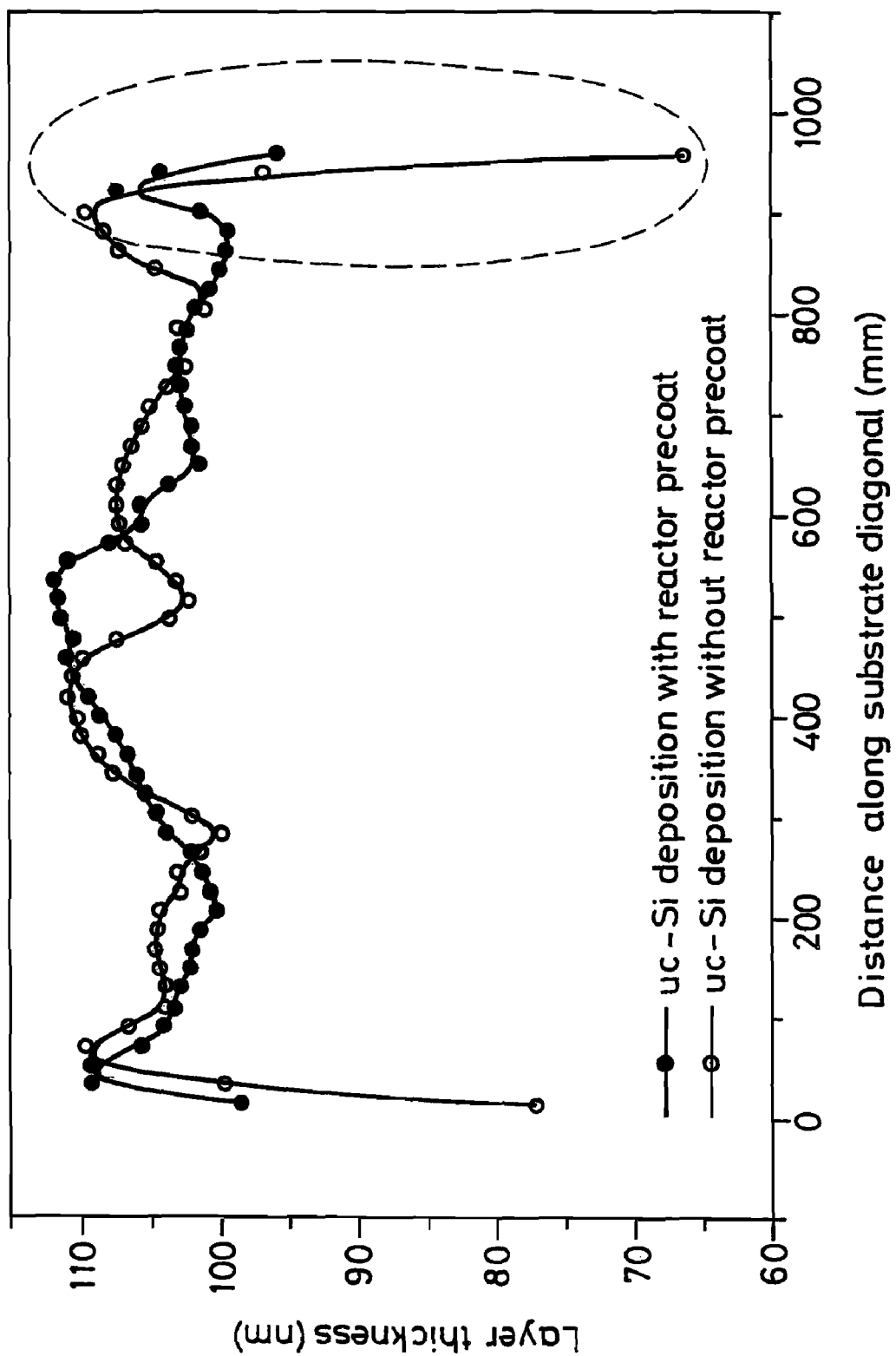
Figure 6A:
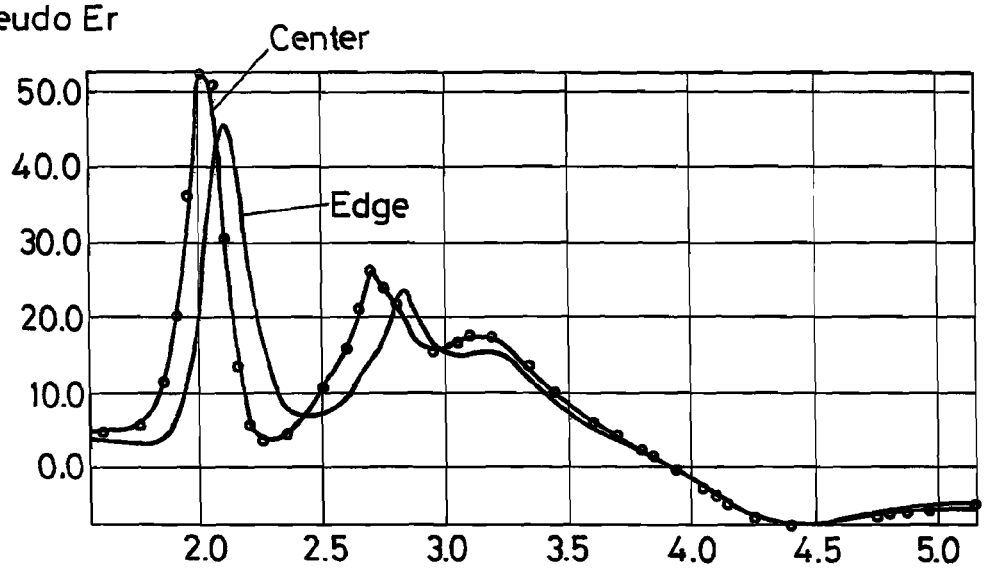
Figure 6B:
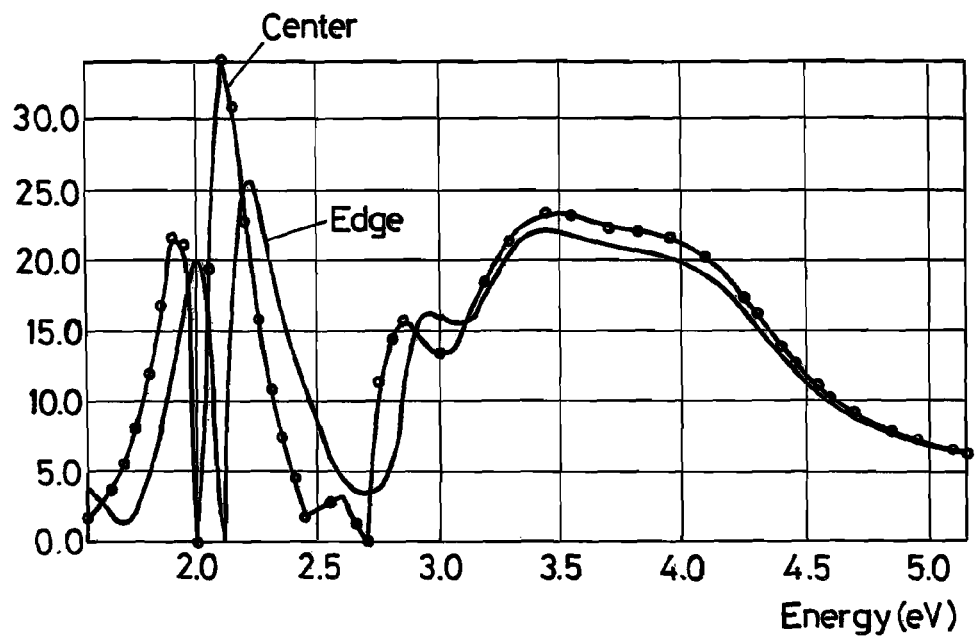
Figure 7A:
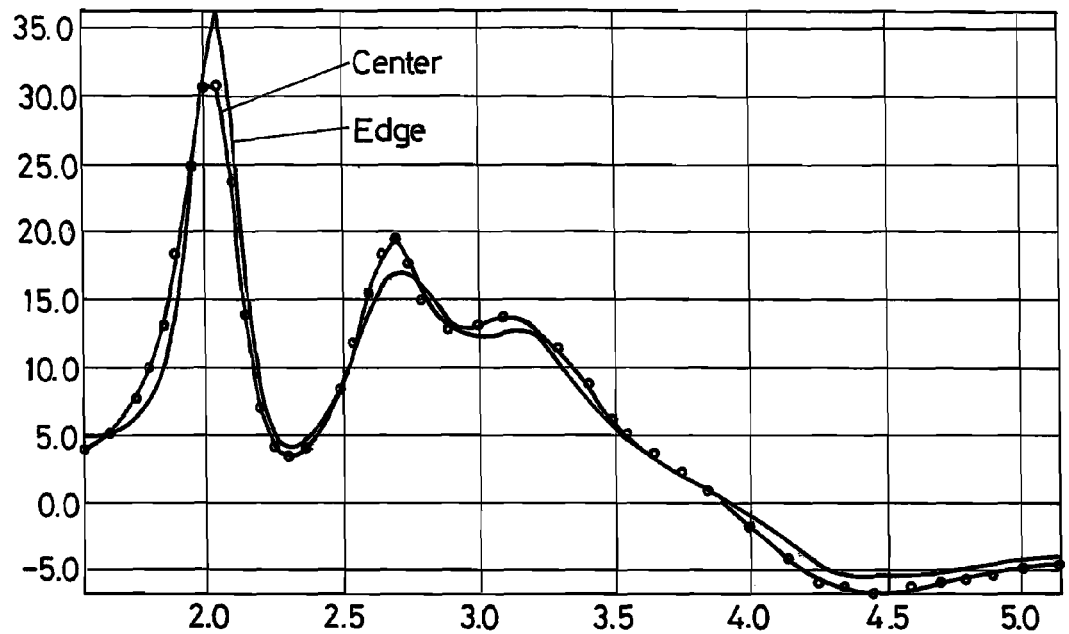
Figure 7B:
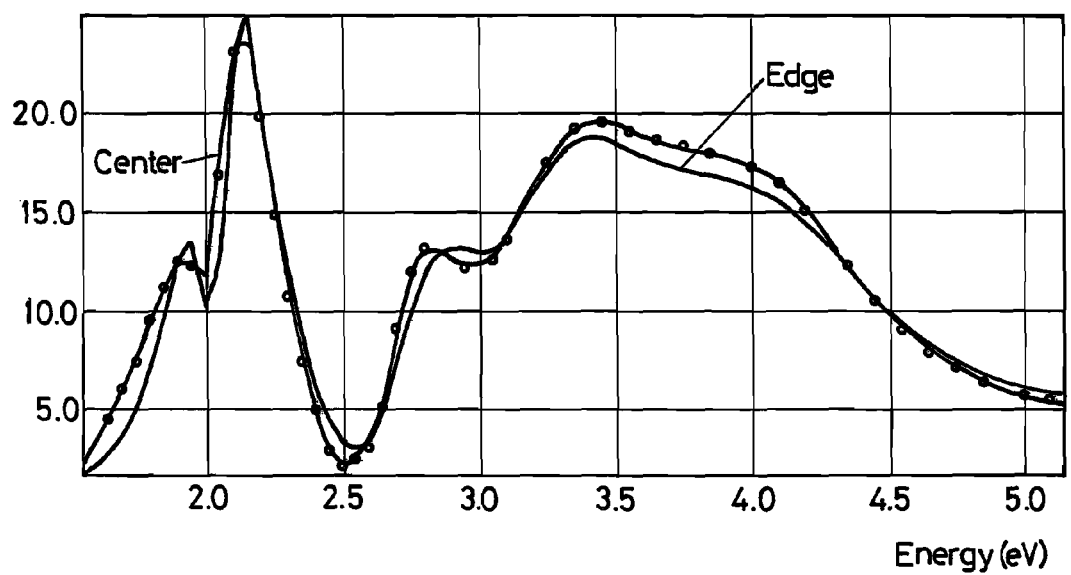

The present invention shall now further be exemplified to the skilled artisan with the help of additional explanations and examples as well as with the help of figures. The figures show:

FIG. 1 In a simplified, schematic representation, one type of PECVD vacuum reactor which may and is presently used to operate the method according to the present invention;

FIG. 2 a flow-chart of the method according to the present invention;

FIG. 3 still simplified and schematically, a part of the reactor as shown in FIG. 1 for explaining step by step applying coatings according to the present invention;

FIG. 4 layer thickness distribution at a μc-Si layer deposited on a substrate in customary technique;

FIG. 5 in a representation according to that of FIG. 4, thickness distribution of customarily deposited μc-Si on a substrate and such thickness distribution along the same layer, deposited under the same conditions, but according to the present invention;

FIGS. 6a and 6b the real and imaginary components of a pseudo-dielectric function which is representative of layer thickness and material structure and as measured at a customarily deposited μc-Si layer, in a center and in an edge area of the substrate, and FIGS. 7a and 7b real and imaginary components of the pseudo-dielectric function according to FIG. 6 resulting when the same layer as of FIG. 6 is deposited on the substrate according to the present invention, again measured in the addressed center and edge area of the substrate.

FIG. 1 schematically shows a simplified vacuum reactor 1 as may be used to operate the method according to the present invention. The vacuum reactor comprises a surrounding reactor wall 3 which is metallic and customarily made of an aluminum magnesium alloy. Within the vacuum reactor there operates a two-dimensionally extended gas shower electrode 5, which, as schematically shown in FIG. 1, is at least in part electrically isolated from the wall 3 of the vacuum reactor 1. The gas shower electrode 5 is on one hand electrically operationally connected to a power supply unit 7 and on the other hand to a gas supply as schematically shown by the arrow G. The respective gas or gas mixture is introduced to the gas shower electrode 5 and is inlet through a multitude of gas inlet openings g to the reaction space R of the vacuum reactor. Uniform gas distribution along the reaction space R is e.g. achieved by respective two-dimensional distribution of the gas inlet openings g via a distribution chamber 9 in the gas shower electrode 5. Opposite to the gas shower electrode 5 there is provided in the vacuum reactor 1 a substrate carrier electrode 11 which is either operated on the same potential as wall 3 of the vacuum reactor or which is operated at an electric potential different therefrom, which necessitates, in such case, electrical isolation of the substrate carrier electrode 11 from the wall 3 of the vacuum reactor 1. By means of the supply unit 7 electric power is applied to the two electrodes 5 and 11 as suited to deposit electrically non- or at least very low-conductive layers. Thus, the supply unit 7 provides for an electrical RF supply of the electrodes 5 and 11 or for an RF supply with DC bias or for pulsed RF supply or for a high-repetition frequency pulsed DC supply etc.

Additional members which are mandatory for a vacuum reactor as e.g. vacuum pumping port, input/output loadlock etc., are not shown in the schematical FIG. 1 as perfectly known to the skilled artisan.

FIG. 2 shows a flow-chart of the method according to the present invention. In a first method step there is generated an RF plasma discharge with one of the suited electrical supplies as schematically shown in the supply unit 7, within the reaction space R between the gas shower electrode 5 and the substrate carrier electrode 11. With the help of such RF plasma discharge and inletting a respective reactive gas into the reaction space R, there is deposited on at least a part of the inner surface of the reactor a dielectric precoat 13. Such precoat 13 is shown in FIG. 3 at those relevant parts of the reactor type of FIG. 1, where it is mandatory. Thereby, as obvious, the thickness of the addressed precoat 13 is largely exaggerated for clearness sake.

With an eye on the steps of generating an RF plasma discharge in the reaction space between the addressed electrodes and inletting a respective gas or gas mixture, thereby depositing the addressed dielectric precoat, this should not be understood as being done in the time sequence according to the sequence of wording and mentioning such steps here. E.g. it may be possible to first inlet the gas or gas mixture to the reaction space and then to establish the RF discharge or to establish the RF discharge and then to inlet the gas or gas mixture. Important is that deposition of the precoat starts when both conditions are met, namely RF discharge established and gas or gas mixture present in the reaction space R.

The dielectric precoat 13 must be applied along at least the peripheral area of the substrate carrier electrode 11 and along the surface areas of the wall 3, which laterally surround the edge of the substrate carrier electrode 11.

Especially when making use of a vacuum reactor type as shown in FIG. 1 the dielectric precoat is PECVD deposited, thereby of at least one of the following materials: silicon oxide, silicon nitride, silicon oxynitride, fluorinated silicon oxide. In today's embodiments silicon nitride is used. The thickness of the precoat as applied, d, is $$200 \text{ nm} \leq d \leq 500 \text{ nm}$$

and thereby in a today's embodiment $$200 \text{ nm} \leq d \leq 400 \text{ nm}.$$

PECVD processing is thereby controlled so as to lead in today's embodiment to an amorphous material structure of the addressed precoat 13.

Today, before every such precoating, there is performed RF plasma reactive cleaning of the metallic inner surface of wall 3 e.g. making use of a gas mixture comprising $SF_6$—$O_2$. Nevertheless, and as addressed later, such cleaning before each precoating step—which latter is mandatory before each single substrate treatment—may be omitted and replaced e.g. by a cleaning step after each third substrate or even just when it becomes necessary.

With an eye on the parts of the wall 3 which are, according to the present invention, to be covered by the dielectric precoat, the parts as shown at 13 in FIG. 1, are substantially those of the reactor type according to FIG. 1, which mandatorily have to be covered to fully exploit the effect according to the present invention. According to FIG. 2 and in a further step after precoating there is introduced one single large surface substrate with an extent of at least 2500 cm² e.g. of glass into the reactor and, making use of the reactor type of FIG. 1, is deposited on the substrate carrier electrode 11. Thereby, in today's operated embodiments, the substrate 15 is smaller than the substrate carrier electrode 11, so that latter protrudes all around the substrate.

In FIG. 3 there is shown, schematically, an enlarged portion of the periphery area of the substrate carrier electrode 11 coated with the dielectric precoat 13 and with the lateral area of the precoated vacuum reactor wall 3. The substrate 15 is introduced and is deposited on the substrate carrier electrode 11. Then the substrate carrier electrode 11 the substrate 15 and thereby especially its upper surface 15$_o$ is coated with a dielectric layer 17. In today's embodiments the dielectric layer 17 as shown in FIG. 3 is made of at least one of a silicon oxide, silicon nitride, silicon oxynitride, fluorinated silicon oxide. The same material may be selected as has been deposited as precoat 13. Nevertheless, the material structure of precoat 13, which is in today's embodiments amorphous so as to reduce internal stress and thereby improving adhesion to the metallic surface of wall 3, the dielectric layer 17 deposited upon the substrate 15, again by PECVD when making use of the reactor type as shown in FIG. 1, needs not be the same but may be crystalline.

The substrate 15 is in today's manufacturing of glass.

Note that already when depositing the dielectric layer 17 upon the substrate 15 there is substantially no metallic surface of wall 3 which may be seen from the reaction space 3 adjacent to the substrate 15 to be coated. Therefore, no such metallic surface may influence the etching to deposition equilibrium when depositing the dielectric layer 17 upon the substrate 15. Thereby, already the dielectric layer 17 is deposited with a substantially uniform thickness and with a substantial uniform material characteristics all along the surface 15$_o$ of the substrate 15.

After having performed dielectric layer deposition on the substrate 15 upon the addressed dielectric layer 17 a silicon layer of μc-Si is PECVD deposited. This μc-Si layer is shown in FIG. 3 in dash lines at reference No. 19. It has to be emphasized that when, by PECVD the μc-Si layer 19 is deposited, the reaction space R does again not see any metallic surface of wall 3 which would change the etching to deposition equilibrium along the peripheral area of substrate 15. Thickness and structure of the μc-Si layer becomes uniform along the substrate surface 15.

For depositing the Si layer 19 as a μc-Si layer etching radicals are exploited. In order to achieve a fully crystallized material structure of layer 19, it is grown from a gas or gas mixture in today's embodiment from $SiF_4$, which produces growth-contributing radicals (silicon-containing radicals) as well as etching radicals (fluorine-containing radicals). Although the growth mechanism is not fully understood it is known that the growth is mainly governed by the balance or equilibrium between etching radicals and deposition radicals (see P. Roca i Cabaroca et al.) Different radicals/surface interactions may occur when a metallic surface, as an aluminum magnesium surface of the reactor wall—including electrode surfaces—is exposed to the activated gas on one hand and, on the other hand, substrate material, as glass, is exposed to the same plasma-activated gas. As in a standard PECVD reactor e.g. of the type as shown in FIG. 1, the substrate is lying on the substrate carrier electrode 11 and with an eye on FIG. 3, such etch-to-deposition balance would be extremely perturbed near the edge of the substrate 15, if the precoat 13 was not present. The precoat first improves uniformity of the dielectric layer deposition and then improves, combined with such dielectric layer, uniformity of μc-Si layer deposition.

It has further to be noted that the precoat step, the deposition step for the dielectric layer on the substrate, the deposition step for the μc-Si layer as well as the deposition steps for subsequent layers before repeating all the addressed steps for a further single substrate, are advantageously performed in one and the same vacuum reactor.

In context of FIG. 1 we have shown a customarily used PECVD vacuum reactor, in fact a parallel electrode PECVD reactor. It goes without saying for the skilled artisan, that other and different known PECVD reactor types might be used for operating the present invention. Practically always, in PECVD layer deposition on a substrate as addressed there will be present at the edge of the substrate substrate material and metallic material of the recipient equipment, making precoating as was described necessary to improve especially μc-Si layer uniformity. As an example, instead of a parallel plate PECVD reactor of the type as shown in FIG. 1 it is possible to apply a PECVD reactor, whereat the gas or gas mixture is activated by a microwave plasma.

FIG. 4 shows the non-uniformity of a μc-Si layer near the edge of a glass substrate. On a glass substrate of 720 mm×650 mm a stack of 200 nm SiN and of 105 nm μc-Si was deposited in a PECVD reactor principally as shown in FIG. 1. There was used a reactor type KAI 1XL as commercially available from the applicant. The carrier electrode 11 was larger than the substrate by 1 cm on each of the sides. No precoating was performed. The large non-uniformity region at the edges of the substrate is obvious, where the thickness average decreases from a value of 105 nm to as low as 80 nm.

EXAMPLE 1

Bottom gate (BG) μc-Si:H TFTs were produced at 200° C. to about 330° C. First, the reactor wall was cleaned as by plasma cleaning with the $SF_6/O_2$ gas mixture. Then the reactor wall was coated with a low-stress SiN-layer. Thereby, as already addressed, a thickness optimum for the precoating is between 200 nm and about 500 nm.

In a Unaxis KAI 1XL PECVD system electrically supplied at an RF frequency of 13.56 MHz, 110 sccm of $SiH_4$, 800 sccm of $NH_3$, 800 sccm of $N_2$ and 500 sccm of $H_2$ were injected. The process pressure was 0.75 mbar and RF power 850 W for the electrode surface of 5000 cm². The substrate was again a 720 mm×650 mm glass substrate (substrate surface about 4700 cm²). The addressed parameters led to deposition of amorphous silicon nitride having a low internal stress as a precoat dielectric layer 13 according to FIG. 1 along the significant inner surface areas of the reactor. After the deposition of the precoating layer, the glass substrate of the addressed dimension was transferred into the vacuum reactor as of reactor 1 of FIG. 1 and a TFT stack of layers was deposited without interrupting the vacuum and with techniques and recipes which are known in the art and which were as follows:

The first layer was made of the same dielectric material, thus silicon nitride, as the precoating layer. The typical thickness for this dielectric layer deposited on the substrate is between 200 nm and 500 nm too. For a thickness of the dielectric layer applied to the substrate, layer 17 of FIG. 3, below 300 nm the thickness of the precoating layer, 13 in FIG. 3, may be required to be at least 400 nm. This because uniformity requirements which are in percentage and more critical to be fulfilled for thinner layers.

After depositing the dielectric layer on the substrate, a μc-Si layer with a thickness of about 150 nm was deposited from a plasma-activated gas-mixture comprising to a greater part a fluorine rich silicon-containing gas, as $SiF_4$, hydrogen and an inert gas, typically Ar with a ratio of fluorine rich silicon-containing gas to hydrogen in the range from 1:1 to about 1:10 and with a ratio of fluorine rich gas to inert gas from 1:10 to about 1:30. The μc-Si layer was deposited at a rate of approx. 0.1 nm per second.

Then the layer stack was completed in order to achieve a functional TFT device structure, i.e. by deposition of a $n^+$ a-Si:H contact layer with a thickness of about 30 nm. If required an additional a-Si:H material layer may be added prior to the ohmic contact layer deposition, in order to avoid leakage of current when a respective transistor device is in its off state ($I_{off}$). Due to a potential higher deposition rate, the completion of the intrinsic layer of μc-Si with a standard amorphous silicon layer may improve the average machine throughput.

EXAMPLE 2

After deposition of a precoating layer as was explained in context with example 1 the glass substrate is transferred into the PECVD vacuum reactor and a TFT layer stack is deposited starting with a different dielectric layer. Thereby, 80 sccm $SiH_4$, 350 sccm $NH_3$, 620 $N_2$ and 1200 sccm $H_2$ were injected. The process pressure was 0.6 mbar at an RF power of 750 W. Then a μc-Si layer with a thickness of about 150 nm was deposited from a gas mixture comprising to a greater part a fluorine rich silicon-containing gas, $SiF_4$, a silicon rich gas, $SiH_4$, hydrogen and an inert gas, Ar, with a ratio for the considered example of fluorine rich to silicon rich to hydrogen to noble gas of 10:1:100:400. The layer stack was completed in order to achieve functional TFT, by deposition of a $n^+$ a-Si:H contact layer with a thickness of about 30 nm. All the parameters not specified here were as in example 1.

EXAMPLE 3

BG μc-Si:H TFTs were produced at 200° C. to about 330° C. First and after cleaning, the reactor wall was precoated with a dielectric precoat with a thickness of 400 nm. The precoat layer was of fluorinated silicon oxide. In an equipment used for the examples 1 and 2, such a layer was deposited using 100 sccm of $SiH_4$, 100 sccm of $SiF_4$, 400 sccm of $N_2O$ and 100 sccm of Ar at a process pressure of 0.5 mbar and an RF power of 200 W. The substrate extent was as addressed in the examples 1 and 2. These parameters led to a deposition of amorphous fluorinated silicon oxide with low internal stress. After having deposited such precoat layer the glass substrate was transferred into the reaction chamber and a TFT stack was deposited without interrupting the vacuum in the PECVD reactor and with techniques and recipes known in the art. E.g the first layer, the dielectric layer, was deposited by PECVD with the following recipe: 80 sccm of $SiH_4$, 350 sccm of $NH_3$, 620 sccm of $N_2$ and 1200 sccm of $H_2$ at a process pressure of 0.6 mbar and an RF power of 750 W. Then a μc-Si layer with a thickness of about 120 nm was deposited from a gas mixture comprising in a predominant part a fluorine rich silicon gas as $SiF_4$, hydrogen and an inert gas, Ar, with a $SiF_4/H_2$ ratio in the range from 1:1:1:10 and a $SiF_4$/inert gas ratio from 1:10 to about 1:30. The μc-Si layer was deposited at a deposition rate of approx. 0.1 nm per second at a reactor temperature of 230° C. Then the layer stack was completed in order to achieve functional TFT, i.e. by deposition of a $n^+$ a-Si:H contact layer of about 30 nm.

By applying the dielectric precoat to the inner surface of the vacuum reactor both layers applied to the substrate, namely the dielectric layer as well as the μc-Si layer, showed enhanced thickness uniformity over the large-area substrate of about 4700 cm² and did not show any of the common location-dependent properties which were observed under exactly the same processing conditions, but without providing the precoat.

FIG. 5 shows the improvement over the example as shown in FIG. 4, of thickness uniformity for the resulting μc-Si layer of about 100 nm applied on top of a silicon nitride layer of 400 nm due to using precoating as described in context with example 1. As for the results according to FIG. 4, the thickness profile results in FIG. 5 were measured with interferometric measurement along the diagonal of the substrate of 720 mm×650 mm, whereupon the same stack of layers was applied in the KAI 1XL reactor as for the experiment which lead to the result as shown in FIG. 4 and also shown in FIG. 5 for comparison purposes. The precoat of SiN was applied with a thickness of about 200 nm. Thereby, as a precoat material the same SiN material was used as for the dielectric layer within the stack on the substrate.

Thus, besides of providing the precoat all processing parameters were kept the same as for processing the substrate leading to the FIG. 4 results and also shown in FIG. 5. As may clearly be seen processing according to the present invention led to a significant improvement of thickness uniformity along the substrate and up to its edge, namely to an improvement of 25% deviation with respect to the average thickness without precoat, to a significantly reduced deviation of 7% with respect to the average thickness when applying the precoat.

Further, by providing the dielectric precoat according to the present invention uniformity of the layer quality along the substrate is greatly improved. Such quality uniformity of a layer can be checked by using spectroscopic ellipsometry at different locations of the coated substrate. Spectroscopic ellipsometry is a non-destructive optical technique used to determine the optical properties of substrates with thin films. Using an appropriate model to fit experimental measurements, it allows to have access to structural information such as thickness of layers, type of material, crystalline fraction, roughness, etc.

In order to have insight to film quality, spectroscopic ellipsometry was performed on the μc-Si film deposited on a 400 nm SiN layer on the substrate. The μc-Si layer was grown from a $SiF_4$, $H_2$ and Ar gas mixture to an average thickness of about 120 nm. The SiN dielectric layer and the μc-Si layer were deposited on a glass substrate, again with a KAI 1XL PECVD reactor. Before transferring the glass substrate into the vacuum reactor the reactor was cleaned with plasma-activated $SF_6/O_2$ and then precoated with a 400 nm SiN layer of the same type as afterwards deposited on the substrate.

For comparison purposes the same substrate coating with the same processing parameters was performed but without precoating the inner wall of the PECVD reactor.

FIGS. 6a,b and 7a,b represent imaginary (Ei) and real (Er) parts of a pseudo-dielectric function of the two μc-Si films deposited as was just addressed, i.e. without (FIG. 6) precoating of the PECVD reactor and (FIG. 7) with precoating.

The complex dielectric function $E(w)=E_r(w)+iE_i(w)$ describes the response of a medium to a static or oscillating electric field. It is a function of frequency w and thus of energy of the electric field as applied. The dielectric function can be considered as a fingerprint of the material investigated with respect to its reaction on electric field exposure. Therefore, the dielectric function is very dependent on the type of material and on material structure. Materials of different composition will also exhibit different dielectric functions.

In the present case the dielectric function is called "pseudo" for two reasons:

First, because it is not directly measured, but calculated from an optical index that is directly derived from ellipsometric spectra.

Secondly, it can be defined for a stack of material while the dielectric function per se is considered as directed on the intrinsic property of one material. Two stacks of materials having different thicknesses will also appear to have different pseudo-dielectric functions. Moreover, in the pseudo-dielectric function there is some interference that can also reveal a thickness variation which, with an eye on FIG. 6, becomes quite obvious when considering the peak positions below 3 eV changing when changing the location as investigated on the one substrate.

Behavior of the pseudo-dielectric function is displayed in both FIGS. 6 and 7 for two distinct locations on the 650 mm×720 mm glass substrate. The characteristics CENTER show results at the central location for the ellipsometric measurement, while the characteristics EDGE show results for ellipsometric measurement adjacent the substrate periphery, i.e. at a distance of 40 mm from the substrate edge. For a non-precoated reactor the results—FIG. 6—show a sensible thickness variation between the two locations as clearly shown in FIG. 6 which substantially disappear when precoating of the vacuum reactor was performed, as clearly shown in FIG. 7.

It has been shown that the method according to the present invention leads to improved thickness and quality uniformity of a μc-Si layer deposited on large-surface substrates.

It has further to be noted that even if, after processing a substrate according to the present invention and before processing the next substrate, the inner surface of the reactor is not cleaned each time, but there is just applied the precoating, the precoating will bind loose particles to the wall of the reactor which will be integrated into the precoat material, thereby preventing such particles from flaking off. Thus, by precoating the wall of the reactor before each single substrate processing contributes to establishing a "clean" reactor wall without necessarily having to perform a specific cleaning step.

What is claimed is:

1. A flat substrate member with an extent of at least 2500 $cm^2$ comprising:
   a substrate with a first surface and a second surface; and
   a layer stack supported upon said first surface of said substrate, wherein said layer stack comprises
      a first dielectric layer deposited onto said first surface of said substrate;
      a microcrystalline silicon layer deposited onto said first dielectric layer and separated from said substrate by said first dielectric layer;
      a second dielectric layer separated from said first dielectric by said microcrystalline silicon layer; and
      a subsequent silicon-containing layer deposited onto said second dielectric layer, wherein at least one of said microcrystalline silicon layer, said first dielectric layer, said second dielectric layer, and said subsequent silicon-containing layer comprise a thickness uniformity adjacent to an edge of said substrate that deviates from average thickness by at most 7% of said average thickness.

2. The flat substrate member of claim 1, wherein at least one of said microcrystalline silicon layer and said subsequent silicon-containing layer comprises Fluorine.

3. The flat substrate member of claim 1, wherein at least one of said microcrystalline silicon layer and said subsequent silicon-containing layer comprises at least one of a halogen and hydrogen.

4. The flat substrate member of claim 1, wherein at least said first surface of said substrate comprises an exposed glass surface.

5. The flat substrate member of claim 1, wherein at least one of said first and second dielectric layers comprises at least one of silicon oxide, silicon nitride, silicon oxinitride, and fluorinated silicon oxide.

6. The flat substrate member of claim 1, wherein at least one of said first and second dielectric layers comprises a thickness d for which there is valid:

200 nm≦d≦500 nm.

7. The flat substrate member of claim 1, wherein at least one of said first and second dielectric layers comprises a thickness d for which there is valid:

200 nm≦d≦400 nm.

8. The flat substrate member of claim 1, wherein at least one of said first and second dielectric layers is amorphous.

9. The flat substrate member of claim 1 being a substrate member for a liquid crystal display device.

10. The flat substrate member of claim 1 being a substrate member for a TFT display device.

11. The flat substrate member of claim 1 being a substrate member for a solar cell device.

12. The flat substrate member of claim 1 being a substrate member for an organic light-emitting display panel.

13. The flat substrate member of claim 1, wherein said microcrystalline silicon layer and subsequent silicon-containing layer are both semiconducting layers of a semiconductor device.

* * * * *